(12) United States Patent
Van Der Cammen

(10) Patent No.: US 9,564,856 B2
(45) Date of Patent: Feb. 7, 2017

(54) AMPLIFIER CIRCUIT WITH IMPROVED ACCURACY

(71) Applicant: QUALCOMM Technologies, Inc., San Diego, CA (US)

(72) Inventor: Peter Van Der Cammen, Berkel en Rodenrijs (NL)

(73) Assignee: Qualcomm Technologies, Inc., San Diego, CA (US)

( * ) Notice: Subject to any disclaimer, the term of this patent is extended or adjusted under 35 U.S.C. 154(b) by 0 days.

(21) Appl. No.: 14/758,810

(22) PCT Filed: Jan. 9, 2013

(86) PCT No.: PCT/EP2013/050283
§ 371 (c)(1),
(2) Date: Jul. 1, 2015

(87) PCT Pub. No.: WO2014/108179
PCT Pub. Date: Jul. 17, 2014

(65) Prior Publication Data
US 2015/0349717 A1    Dec. 3, 2015

(51) Int. Cl.
H03F 1/02      (2006.01)
H03F 3/19      (2006.01)
H03F 3/45      (2006.01)
H03F 3/193     (2006.01)
(Continued)

(52) U.S. Cl.
CPC .............. *H03F 1/0205* (2013.01); *H03F 3/19* (2013.01); *H03F 3/193* (2013.01); *H03F 3/245* (2013.01); *H03F 3/45183* (2013.01); *H03G 3/3036* (2013.01); *H03F 2200/135* (2013.01); *H03F 2200/294* (2013.01); *H03F 2200/393* (2013.01); *H03F 2200/405* (2013.01); *H03F 2200/447* (2013.01); *H03F 2200/451* (2013.01); *H03F 2200/555* (2013.01); *H03F 2200/78* (2013.01); *H03F 2203/45454* (2013.01); *H03F 2203/45466* (2013.01); *H03F 2203/45594* (2013.01);
(Continued)

(58) Field of Classification Search
USPC ................... 330/252–261, 310, 98, 133, 150
See application file for complete search history.

(56) References Cited

U.S. PATENT DOCUMENTS 5,839,060 A    11/1998  Kasperkovitz et al.
6,738,601 B1    5/2004  Rofougaran et al.
(Continued)

FOREIGN PATENT DOCUMENTS

WO    2011161858 A1    12/2011

OTHER PUBLICATIONS

International Search Report and Written Opinion—PCT/EP2013/050283—ISA/EPO—Aug. 20, 2013.

*Primary Examiner* — Hieu Nguyen
(74) *Attorney, Agent, or Firm* — Smith Tempel Blaha LLC

(57) ABSTRACT

An amplifier circuit with improved accuracy is provided that comprises a cascade of amplifier stages, a control line for controlling the amplifier stages, a feedback circuit having an input port for receiving a reference signal, and a feedback loop connecting the feedback circuit to the control line. Via the feedback circuit and the feedback loop, the large signal behavior of the amplifier stage is accurately fixed. As a result, the small signal gain of the amplifier stages has an improved accuracy as well.

11 Claims, 3 Drawing Sheets

(51) Int. Cl.
  *H03F 3/24*     (2006.01)
  *H03G 3/30*     (2006.01)
(52) U.S. Cl.
  CPC ............. *H03F 2203/45596* (2013.01); *H03F 2203/45702* (2013.01)

(56) References Cited

U.S. PATENT DOCUMENTS

| | | | |
|---|---|---|---|
| 7,415,256 B2 * | 8/2008 | Nakano | H04B 17/318 455/130 |
| 2007/0058739 A1 | 3/2007 | Aytur et al. | |
| 2008/0191889 A1 | 8/2008 | Nakamoto | |

* cited by examiner

AMPLIFIER CIRCUIT WITH IMPROVED ACCURACY

The present invention refers to amplifier circuits, e.g. for RSSI systems, with improved accuracy especially of the large signal behavior.

An RSSI (RSSI=Radio Signal Strength Indicator) can be used to generate information about the amplitude or power level of an electrical signal propagating in a signal line. An RSSI can be utilized in mobile communication devices to monitor the power level of an RF signal being emitted or received. Such RSSI systems should be able to monitor the power level of a large dynamic range.

An RSSI system can comprise a chain of amplifiers, e.g. limiter amplifier stages, where the output port of one amplifier is connected to the input port of the next amplifier. It was found that RSSI systems providing an accurate level signal even at high frequencies is not a triviality.

It is, therefore, an object of the present invention to provide an amplifier circuit that has an improved accuracy, especially of the large signal behavior. It is another object of the present invention to provide an amplifier circuit having an improved accuracy, especially at high signal frequencies.

To achieve the above-mentioned objects, an amplifier circuit according to claim 1 is provided. Dependent claims provide preferred embodiments of the invention.

An improved amplifier circuit comprises a cascade of amplifier stages. The cascade provides an RSSI-sum as a measure for the level of a signal at the input of the cascade. The amplifier circuit further comprises a control line for controlling the amplifier stages. For that, the amplifier circuit has a feedback circuit having an input for a reference signal. The amplifier circuit further has a feedback loop connecting the feedback circuit to the control line.

In such an amplifier circuit, the large signal behavior is fixed by the feedback loop. The feedback loop controls the small signal gain of the amplifier stages. In this context, the quantities "large signal behavior" and "small signal gain" are explained with respect to FIG. 6. In an amplifier circuit comprising a cascade of amplifier stages, each amplifier stage provides a level information VS. The I-th amplifier stage provides the level information $VS_I$. All level information are summed. Thus, the total level information of the cascade as a whole is $\Sigma\, VS_i$. For very small signal levels, the signal level $VS_i$ provided by an amplifier stage is mainly identical to the voltage of this stage in the absence of an input signal: $VS_0$. For very large input signals, the amplifier stage—which may be a limiter amplifier stage—is limiting completely (clipping) and the level information provided by the clipping stage is a maximum level information: $VS_{clip}$. The difference $VS_{clip}-VS_0$ defines the large signal behavior of the cascade of amplifier stages.

The RSSI-range is defined as the dynamic range of the input level in which the first amplifier stage of the cascade is operating in a linear region and the last amplifier stage of the cascade is fully overdriven, i.e. limiting completely (clipping). In this RSSI-range, the level information obtained by an amplifier circuit, $\Sigma\, VS_i$, has a linear dependence on the logarithm of the input power level $\log V_{IN}$.

The slope of the $\Sigma\, VS_i$ versus $\log V_{IN}$ curve is proportional to the ratio of the large signal behavior divided by the logarithm of the small signal gain: $(VS_{clip}-VS_0)/\log(A_V)$. The small signal gain $A_V$ is identical to the factor the input power level of an input signal $V_{IN}$ has to multiplied with to increase the sum $\Sigma\, VS_I$ with the large signal behavior $VS_{clip}-VS_0$.

It is possible to use resistors as a summing circuit. When such resistors are used the sum becomes $\text{sum } \Sigma\, VS_i/n$ where n is the number of stages that contribute to the sum. The slope of the $\Sigma\, VS_i$ versus $\log V_{IN}$ curve is also divided by n.

The above described amplifier circuit fixes the large signal behavior by the feedback loop by controlling the small signal gain of the amplifier stages. Thus, the accuracy of the small signal gain and the accuracy of the large signal behavior is improved and, as a consequence, the ratio thereof determining the slope of the $\Sigma\, VS_i$ versus $\log V_{IN}$ curve and its respective accuracy is also improved.

Thus, in one embodiment, the amplifier circuit has a large signal behavior and each amplifier stage has a small signal gain. The feedback loop fixes the large signal behavior and controls the small signal gain.

In one embodiment, each amplifier stage provides a contribution to the RSSI-sum $\Sigma\, VS_i$. At least one amplifier is a clipping amplifier and provides a clipping contribution $VS_{clip}$ to the RSSI-sum.

In one embodiment, at least one of the amplifier stages is a bipolar differential stage having a tail current. The amplifier stage is controlled by adjusting its tail current.

Of course, it is possible that all amplifier stages of the cascade are bipolar differential stages having a tail current and are controlled by adjusting the tail currents.

However, it is not a necessity that the amplifier stages are bipolar differential stages as long as each stage of the cascade can be controlled via the control line.

In one embodiment, $VS_0$ is a minimum contribution to the RSSI-sum. The first amplifier stage of the cascade or a further amplifier stage, which may not be an element of the cascade, provides the contribution $VS_0$.

In one embodiment, an amplifier provides the contribution $VS_0$ and another amplifier provides the contribution $VS_{clip}$. The difference $VS_{clip}-VS_0$, i.e. the large signal behavior, equals the reference signal. Thus, the large signal behavior is fixed by the control loop where the control loop controls the small signal gain of the amplifier stages.

In one embodiment, the reference signal has a temperature dependency chosen to eliminate the temperature dependency of the amplifier circuit.

One example to achieve this is to provide a reference signal that is a PTAT (PTAT=Proportional To Absolute Temperature) signal. Thus, in one embodiment, the reference signal is a PTAT signal.

If the amplifier stages are realized with bipolar differential stages and their tail currents are used to control the gain, then a PTAT tail current results in a constant gain over temperature. For high frequencies, frequency roll-off takes place that reduces the gain. With such a temperature dependence of the reference signal, the large signal behavior can be kept constant over temperature even at high frequencies. The tail current will have to increase with increasing frequency in order to compensate for large signal effects like slewing and droop as the most significant high frequency errors. Thus, if the large signal behavior is forced to be identical to a PTAT signal, temperature stability of the small signal gain is obtained, also for higher frequencies.

It is also possible that for low frequencies, the tail current will be a PTAT current while for higher frequencies, it will be increased to compensate for the large signal effects, thereby also compensating for the frequency roll-off in the small signal gain.

In one embodiment, the reference signal is a reference voltage.

In one embodiment, the amplifier circuit is an RSSI-system or a temperature compensation circuit for another amplifier circuit.

The above-described amplifier circuit provides level information of an input signal and a control signal for amplifier stages. The control signal for the amplifier stages can be temperature compensated. It is possible that the level information is neglected and the temperature compensated control signal is utilized as a control signal for another circuit, e.g. another amplifier circuit.

The amplifier stages of the cascade can be identical amplifier stages. The additional amplifier stages for obtaining $VS_0$ and/or $VS_{clip}$ can be of the same type as the amplifier stages of the cascade. However, it is possible that the additional amplifier stages are of different types.

It is possible that two or more stages are used to generate $VS_0$ and/or $VS_{CLIP}$ in order to increase accuracy.

The additional amplifier $A_0$ can, thus, be a model amplifier, i.e. a replica of one amplifier in the cascade.

The RSSI-sum can be obtained by connecting each level output port of an amplifier stage with an identical resistor to a summing node, where the summing node is connected with a capacitor to an AC ground node in order to obtain the average value of the RSSI-sum. The voltage at the summing node is in that case identical to the sum of all level output voltages divided by the number of states that contribute to the sum.

In one embodiment, the amplifier circuit comprises a summing circuit comprising resistors. Each resistor is connected between a respective output port of an amplifier stage and a common node, e.g. a capacitor to ground. The voltage between the common node and ground can be $1/n \, \Sigma \, VS_I$ where n is the number of stages contributing to the sum.

The working principle and exemplary embodiments are shown in the schematic figures. Details and features shown in a specific figure are not limited to a specific embodiment. Features and details shown in the figures can, thus, be combined to obtain an improved amplifier circuit.

SHORT DESCRIPTION OF THE DRAWINGS

DETAILED DESCRIPTION

Figure 1:
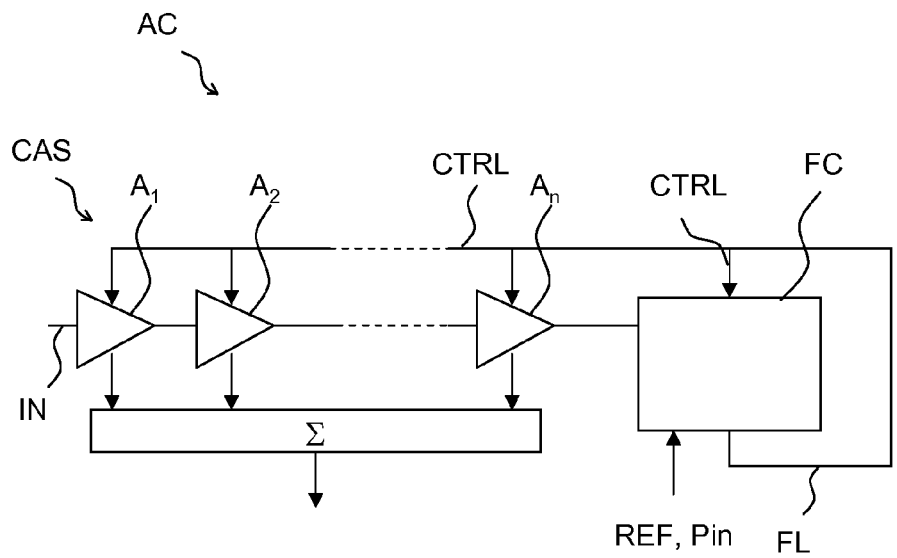
FIG. 1 shows an embodiment of an amplifier circuit AC comprising a chain of amplifier stages $A_1, A_2, \ldots A_n$.

FIG. 1 shows an embodiment of an amplifier circuit AC comprising a cascade CAS of amplifier stages $A_1, A_2, \ldots A_n$. Each amplifier stage $A_i$ contributes to the total RSSI-sum $\Sigma \, VS_i$. To obtain the total RSSI-sum $\Sigma \, VS_i$, the individual contributions are summed. The first amplifier stage A1 receives an input signal IN. The input signal is amplified and fed to the input of the respective next amplifier stage of the cascade CAS.

Each amplifier stage $A_1, A_2, \ldots A_n$ comprises an input for a control signal CRTL. Via the control signal CRTL, the gain of each amplifier stage is controlled. The amplifier circuit AC further comprises a feedback circuit FC having an input port $P_{in}$. Via a feedback loop FL, the feedback circuit FC is connected to a control line feeding the control signal CRTL to the individual amplifier stages. Thus, via the control line CRTL, the amplifier stages, e.g. their respective gain, is controlled. Via the input port $P_{in}$, the feedback circuit FC receives a reference signal REF. The feedback loop FL enables accurately fixing the large signal behavior of the amplifier circuit AC by controlling the small signal gain of the amplifier stages. As a result, the slope of the $\Sigma \, VS_i$ vs. log $(V_{IN})$-curve is fixed and the accuracy of the amplifier circuit is increased.

Figure 2:
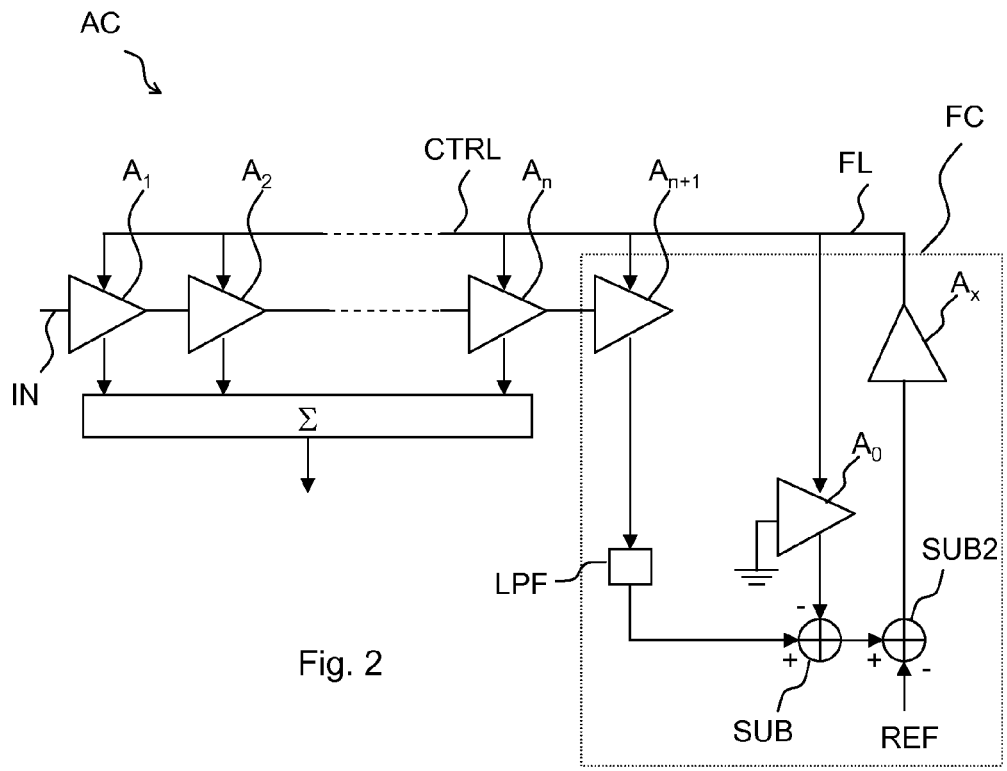
FIG. 2 shows an amplifier circuit with an additional amplifier stage $A_0$.

FIG. 2 shows an embodiment of an amplifier circuit AC where the feedback circuit FC comprises a fully limiting amplifier stage $A_{n+1}$ and an additional amplifier stage $A_0$. The additional amplifier stage $A_0$ has a signal input but no signal is fed into the signal input of the additional amplifier stage $A_0$. Thus, the additional amplifier stage $A_0$ provides the minimum contribution $VS_0$ while the fully limiting amplifier stage $A_{n+1}$ provides the maximum contribution $VS_{clip}$. Further, a feedback circuit FC comprises a subtraction circuit SUB for evaluating the difference $VS_{clip}-VS_0$. Thus, an output of the subtraction circuit SUB provides the large signal behavior $VS_{clip}-VS_0$. Via the feedback loop FL that may comprise another amplifier $A_X$ and another subtraction circuit SUB2, the differences $VS_{CLIP}-VS_0$ is set to the reference signal REF.

The feedback circuit FC may comprise a low pass filter LPF to evaluate the average RSSI contribution of the fully limiting amplifier stage $A_{n+1}$.

Figure 3:
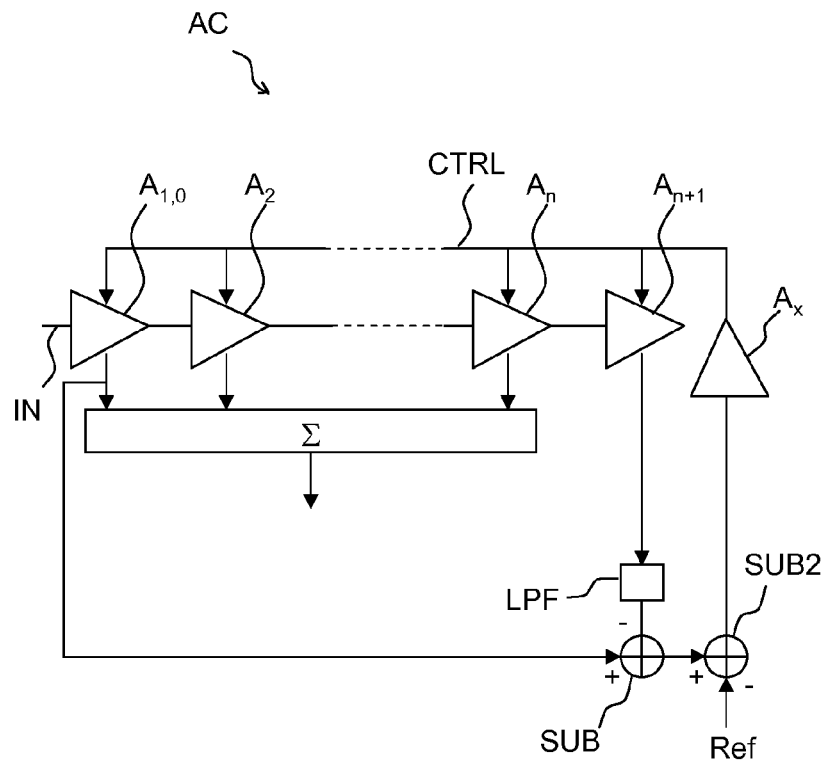
FIG. 3 shows an amplifier circuit where the first amplifier stage $A_1$ is utilized for obtaining $VS_0$.

FIG. 3 shows an embodiment of an amplifier circuit where the first amplifier stage $A_1$ is utilized as an amplifier stage for obtaining $VS_0$. Therefore, the output of the first amplifier stage is fed to the subtraction circuit SUB.

Figure 4:
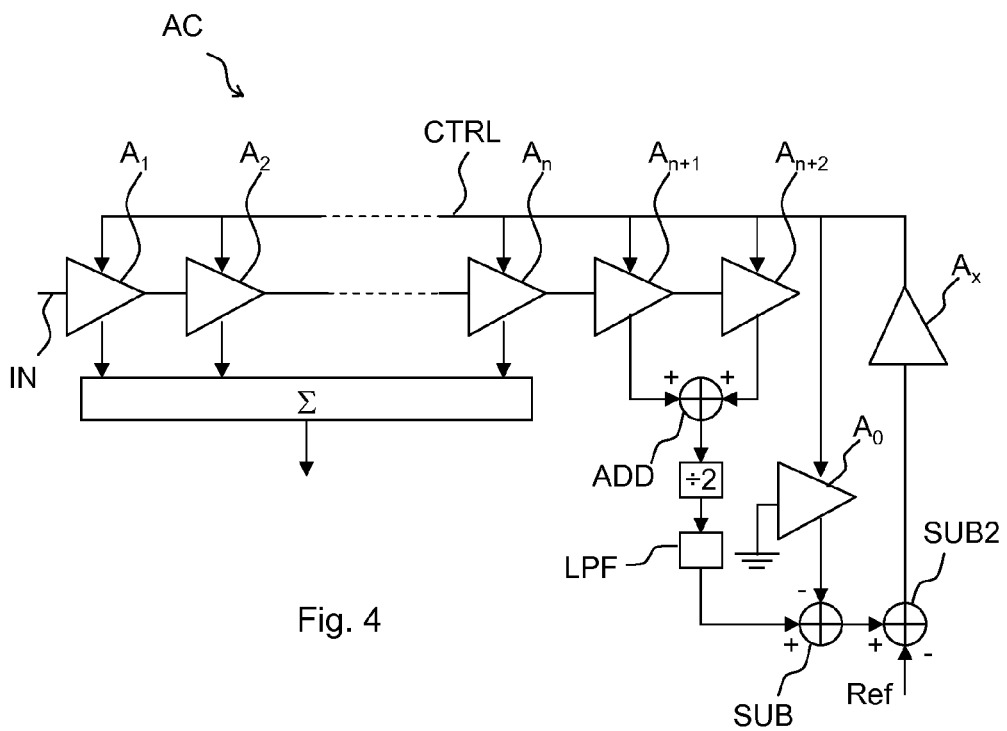
FIG. 4 shows an amplifier circuit where two amplifier stages contribute to the determination of an average value for $VS_{clip}$.

FIG. 4 shows an embodiment of an amplifier circuit AC where the RSSI contribution $VS_{clip}$ is obtained by evaluating the average value of two additional fully limiting amplifier stages $A_{n+1}, A_{n+2}$. For that, the feedback circuit comprises an adding circuit ADD and a division-by-two circuit between the addition circuit ADD and the low pass filter LPF.

Figure 5:
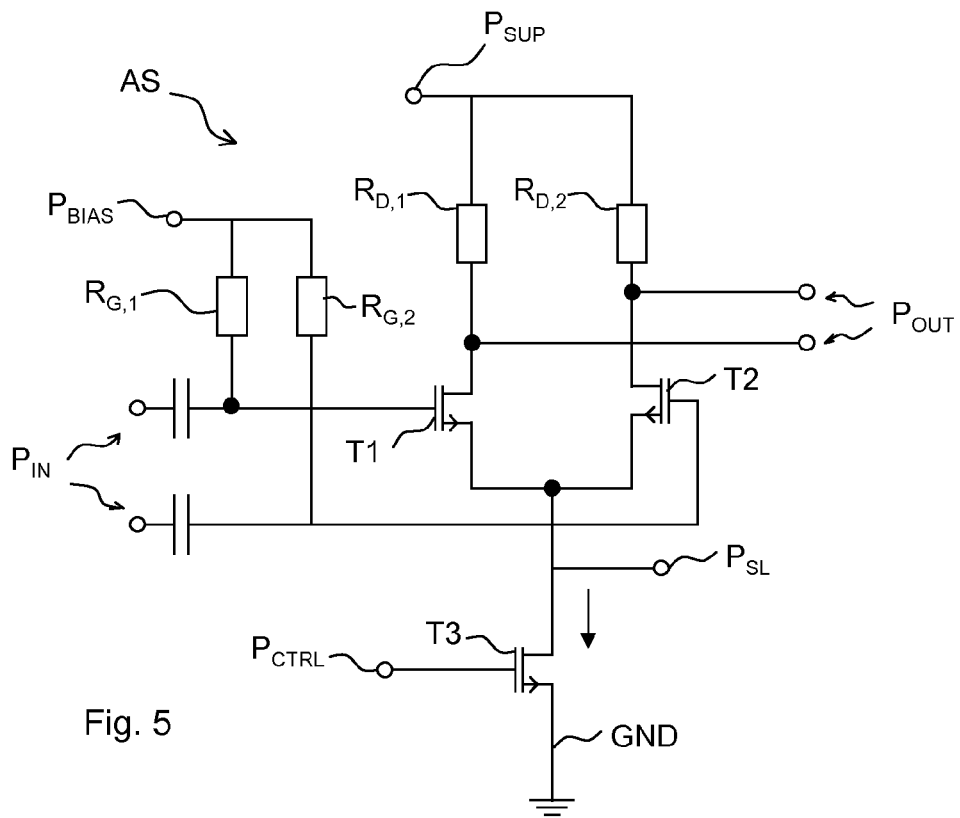
FIG. 5 shows an amplifier stage.

FIG. 5 shows an embodiment of amplifier stage AS. The amplifier stage comprises an input port $P_{IN}$ and an output $P_{OUT}$. The amplifier stage AS may work with balanced signals. Via a control port $P_{CRTL}$, the gain of the amplifier stage AS can be adjusted. The voltage between a signal port $P_{SL}$, and ground can be utilized as the level information provided by each amplifier stage. Via a supply port $P_{SUP}$, the amplifier stage AS can be powered. An output port $P_{OUT}$ can be used to connect the output of the amplifier stage to the input port $P_{IN}$ of the respective next amplifier stage of the cascade. Via a bias port $P_{BIAS}$, a biasing signal can be applied to the amplifier stage AS. T1 and T2 denote transistors that may be NMOS transistors.

However, other circuits for the amplifier stages AS are also possible.

Figure 6:
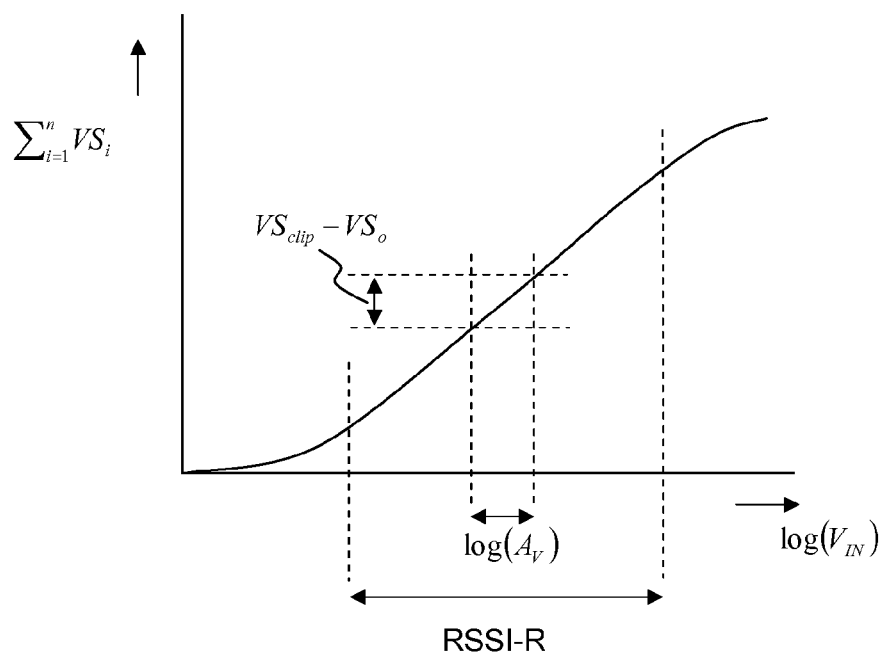
FIG. 6 shows the dependency of $\Sigma \, VS_i$.

FIG. 6 shows the influence of the input level signal $V_{IN}$, or the respective logarithm of the input signal $V_{IN}$, on the RSSI-sum $\Sigma \, VS_i$. In the RSSI range RSSI-R, the slope of the RSSI-sum is mainly constant and determined by the ratio: $(VS_{clip}-VS_0)/\log(A_V)$, i.e. by the ratio: large signal behavior divided by the logarithm of the small signal gain.

By improving the accuracy of the small signal gain and of the large signal behavior, an improved accuracy of the slope and, thus, of the accuracy of a corresponding amplifier circuit is obtained.

An amplifier circuit is not limited to the embodiments described in the specification or shown in the figures.

Amplifier circuits comprising further circuit elements such as further amplifier stages are also comprises by the present invention.

LIST OF REFERENCE SYMBOLS

A1, ... An: amplifier stage
AC: amplifier circuit
ADD: adding circuit
$A_{n+1}$, $A_0$: additional amplifier stages
Ax: amplifier of the feedback loop
CAS: cascade of amplifier stages
CTRL: control line conducting a control signal to the amplifier stages
FC: feedback circuit
FL: feedback loop
IN: input of the cascade
log $A_V$: large signal behavior
LPF: low pass filter
$P_{BIAS}$: bias port of an amplifier stage
PCRTL: control port of the amplifier stage
PIN: input port
POUT: output port of an amplifier stage
PSL: signal port providing level information of an amplifier stage
PSUP: supply port of an amplifier stage
REF: reference signal
$R_{G,1}$, $R_{G,2}$, $R_{D,1}$, $R_{D,2}$: resistive elements of an amplifier stage
RSSI-R: RSSI range
SUB, SUB2: subtraction circuit
$\Sigma\ VS_i$: RSSI-sum
T1, T2, T3: transistor
$V_{IN}$: input signal of the amplifier circuit
$VS_{clip}$–$VS_0$: large signal behavior

The invention claimed is:

1. An amplifier circuit, comprising:
a cascade of amplifier stages, providing an RSSI-sum as a measure for the level of a signal at the input of the cascade, the cascade of amplifier stages having a large signal behavior defined by a difference between a maximum contribution defined by a clipping level of one of the amplifier stages and a minimum contribution corresponding to an output voltage of one of the amplifier stages absent an input voltage, each of the amplifier stages of the cascade of amplifier stages having a small signal gain and a gain control input;
a control line configured to provide a control signal to the gain control input of each of the amplifier stages;
a feedback circuit having an input port for a reference signal, the feedback circuit configured to generate the control signal in response to the reference signal and an output of the cascade of amplifier stages; and
a feedback loop connecting the feedback circuit to the control line, the feedback loop configured to fix the large signal behavior of the cascade of amplifier stages and control the small signal gain of each of the amplifier stages in response to the control signal.

2. The amplifier circuit of claim 1, wherein:
each amplifier stage provides a contribution to the RSSI-sum; and
at least one amplifier stage is a clipping amplifier and provides the maximum contribution to the RSSI-sum.

3. The amplifier circuit of claim 1, wherein the amplifier stages:
are bipolar differential stages each having a tail current; and
are controlled by adjusting their tail currents.

4. The amplifier circuit of claim 1, wherein:
the first amplifier stage of the cascade or a further amplifier stage not being an element of the cascade provides the minimum contribution.

5. The amplifier circuit of claim 1, wherein:
an amplifier stage provides the minimum contribution and another amplifier stage provides the maximum contribution; and
the difference between the maximum contribution and the minimum contribution equals the reference signal.

6. The amplifier circuit of claim 1, wherein the reference signal has a temperature dependency chosen to eliminate the temperature dependency of the amplifier circuit.

7. The amplifier circuit of claim 6, wherein the reference signal is a PTAT signal.

8. The amplifier circuit of claim 1, wherein the reference signal is a reference voltage.

9. The amplifier circuit of claim 1, wherein the amplifier circuit is:
an RSSI-system or
a temperature compensation circuit for another amplifier circuit.

10. The amplifier circuit of claim 1, further comprising:
two or more amplifiers,
where the minimum contribution and/or the maximum contribution are generated by the two or more amplifier stages to increase accuracy.

11. The amplifier circuit of claim 1, further comprising a summing circuit with one resistor per amplifier stage, where a resistor is connected between a respective output port of the amplifier stage and a common node.

* * * * *